United States Patent [19]

Khandekar

[11] Patent Number: 5,926,828
[45] Date of Patent: Jul. 20, 1999

[54] METHOD AND APPARATUS FOR CONTROLLING DATA TRANSFER BETWEEN A SYNCHRONOUS DRAM-TYPE MEMORY AND A SYSTEM BUS

[75] Inventor: Narendra S. Khandekar, Folsom, Calif.

[73] Assignee: Intel Corporation, Santa Clara, Calif.

[21] Appl. No.: 08/599,040

[22] Filed: Feb. 9, 1996

[51] Int. Cl.⁶ ............................. G11C 7/00; G11C 11/24
[52] U.S. Cl. ......................... 711/111; 711/105; 711/167; 365/233; 365/189.01; 395/551; 395/881
[58] Field of Search ............................. 395/182.07, 848, 395/842, 474, 432, 438, 551, 881; 365/233, 189.01; 711/105, 111, 167

[56] References Cited

U.S. PATENT DOCUMENTS

| | | | |
|---|---|---|---|
| 4,792,926 | 12/1988 | Roberts | 365/189.02 |
| 5,134,699 | 7/1992 | Aria et al. | 395/855 |
| 5,159,679 | 10/1992 | Culley | 395/425 |
| 5,268,865 | 12/1993 | Takasugi | 365/189.05 |
| 5,321,651 | 6/1994 | Monk | 365/189.01 |
| 5,390,149 | 2/1995 | Vogley et al. | 365/189.01 |
| 5,513,148 | 4/1996 | Zagar | 365/233 |
| 5,519,872 | 5/1996 | Khandekar et al. | 395/775 |
| 5,526,513 | 6/1996 | Cerutti | 395/496 |
| 5,530,944 | 6/1996 | Stones | 711/167 |
| 5,586,286 | 12/1996 | Santeler et al. | 711/105 |
| 5,640,527 | 6/1997 | Pecone et al. | 711/5 |
| 5,657,287 | 8/1997 | McLaury et al. | 365/230.01 |

Primary Examiner—Eddie P. Chan
Assistant Examiner—Hong C. Kim
Attorney, Agent, or Firm—Blakely, Sokoloff, Taylor & Zafman

[57] ABSTRACT

A synchronous DRAM-type memory control is provided that allows continued and accurate data transfer to and from a synchronous DRAM (syncDRAM) memory for special cases where data is not ready to be transferred. In the event that data is not ready to be transferred between a destination device and the syncDRAM, transfer of data is suspended. Concurrently, at the address from which data was not ready to be transferred, the address is latched by a syncDRAM interface that communicates with the system memory control and the syncDRAM memory. In the event of a read cycle, back to back read requests are asserted until data can be transferred. In the event of a write request, a mask command is asserted to mask out the data address in the syncDRAM until data is ready to be written to the address, wherein the write request is then reasserted. For both read and write cycles, when data is subsequently ready to be transferred, data transfer is resumed at the latched address. This effectively replaces the clock enable functionality and provides cost savings and die size savings.

1 Claim, 6 Drawing Sheets

Interrrupting a SDRAM Read with BDHold

FIG. 6

Interrrupting a Write with BDHold

METHOD AND APPARATUS FOR CONTROLLING DATA TRANSFER BETWEEN A SYNCHRONOUS DRAM-TYPE MEMORY AND A SYSTEM BUS

BACKGROUND OF THE INVENTION

1. Field of the Invention

The present invention generally relates to data communications in a computer system and, more particularly, to memory control design to support synchronous Dynamic Random Access Memory (DRAM) type memory.

2. Description of Related Art

In conventional central processing unit (CPU) designs, speed in which data is transferred within the CPU has been increasing rapidly with the advent Reduced Instruction Set Computer (RISC) architectures and even more so due to extensive use of pipelining. However, unlike the CPU development, development of different types of memory has concentrated on increasing media density in order to reduce the cost per bit of memory and not speed. This disparity has created an imbalance in memory bandwidth required for small low-cost systems. External interleaving to improve memory bandwidth has been employed to overcome this problem, but has failed. External interleaving has become a less favorable option due to use of asynchronous interfaces, high timing margins, high data rate, and a lack of registers for control signals, addresses and Input/Output's. The cost of external interleaving is also high due to additional glue logic and total memory density required for a given bandwidth. This imbalance created the need for synchronous DRAM-type memory units (syncDRAMs).

SyncDRAMs offer extensive memory density with low cost and high bandwidth memory architecture. Furthermore, syncDRAMs are able to support various applications like mainstore, peripherals, graphics and video. SyncDRAMs are designed for a wide range of applications with programmable features such as latency, burst length and burst-type. They can support single or dual bank high frequency and low power operations.

A key feature provided by syncDRAMs is immediate access to multiple blocks of data called "bursts." Burst length refers to the number of words that will be output or input in a read or write cycle respectively. After a read burst has completed, the output bus will become high impedance. The burst length is programmable as 1, 2, 4 or 8 words, or full page. The ability of the CPU to access these bursts of information gives the CPU access to wider bandwidth of memory.

In operation, the syncDRAM is enabled by a command from a memory control unit responding to a data transfer request from the CPU. The syncDRAM responds by enabling an internal clock (CKE#) to begin the command cycle when the clock enable pin is asserted. An address is then internally latched by the syncDRAM from which data will be read or written to. Each time a burst of data is requested, the syncDRAM must go through the initiation sequence in order to access the address from which data will be read or written. The time it takes to complete the initiation process will deficit the overall memory retrieval time needed to access the data.

Accordingly, it would be of great use to a computer industry to further speed up the already efficient syncDRAM memories by reducing the time it takes to access the syncDRAMs by reducing the time it takes to initiate the data retrieving cycle. In the event data is not ready to be transferred, conventional implementations require a second request to send data to or read data from the syncDRAM when the data is ready. This requires a second read or write request which requires initializing the syncDRAM again. Being able to hold the syncDRAM idle and initiated until data is ready would greatly speed up data transfer in the syncDRAM by allowing wait states when data is not ready, so that devices of different speeds than the syncDRAM can adjust. As will be seen, the present invention achieves this in an elegant and cost effective manner.

SUMMARY OF THE INVENTION

The present invention, in one embodiment, provides an interface for a synchronous DRAM (syncDRAM) memory that improves the performance of the system utilizing the syncDRAM. Improved performance is accomplished by forcing the same DRAM to suspend data transfer during a data burst by asserting a hold command in the event that data is not ready to be transferred. The interface is configured to suspend transfer of data to the syncDRAM during a write cycle or out of the syncDRAM during a read cycle while maintaining the latched address internal to the syncDRAM open.

In accordance with one embodiment of the present invention, if the data receiver is not ready, the interface suspends data transfer in the middle of a data burst transfer and holds the address location, internal to the syncDRAM, latched until data is ready. Back to back read requests are then asserted until data is ready to be accepted. When data is ready to be transferred from the syncDRAM, the hold command is deasserted by the interface and data transfer is resumed at the last address latched during the burst sequence. The interface keeps track of the internal address in the syncDRAM with address incrementing logic so that the system stays in synchronicity with the data transfer sequence in the syncDRAM during normal operations or when the syncDRAM incurs a hold cycle.

In the event of a write request, the interface, in accordance with the present invention, allows the system to write data to the syncDRAM during normal operations and, upon the occurrence of data not being ready to be transferred to the syncDRAM, can cease writing operations to the syncDRAM. In the event of a situation where data is not ready, the interface causes the syncDRAM to cease operations and to mask off the address latched internally by the syncDRAM so that data cannot be written to that address. When data is ready, the interface initiates the syncDRAM a second time and latches the last address in the prior writing sequence within the syncDRAM. The write sequence is then completed with data being written to the proper locations in the syncDRAM.

Accordingly, an interface is provided that improves the performance of a system utilizing the synchronous DRAM-type memory by allowing data transfer and, when data is not ready to be transferred, allows a wait state so that the syncDRAM waits until data is ready to continue a burst cycle without having to initiate the syncDRAM again.

DETAILED DESCRIPTION OF THE PREFERRED EMBODIMENT

FIGS. 2 through 6 of the drawings disclose various embodiments of the present invention for purposes of illustration. One skilled in the art will recognize alternative embodiments that may be employed without departing from the principles of the invention that are illustrated by the structures and methods described herein.

Figure 1:
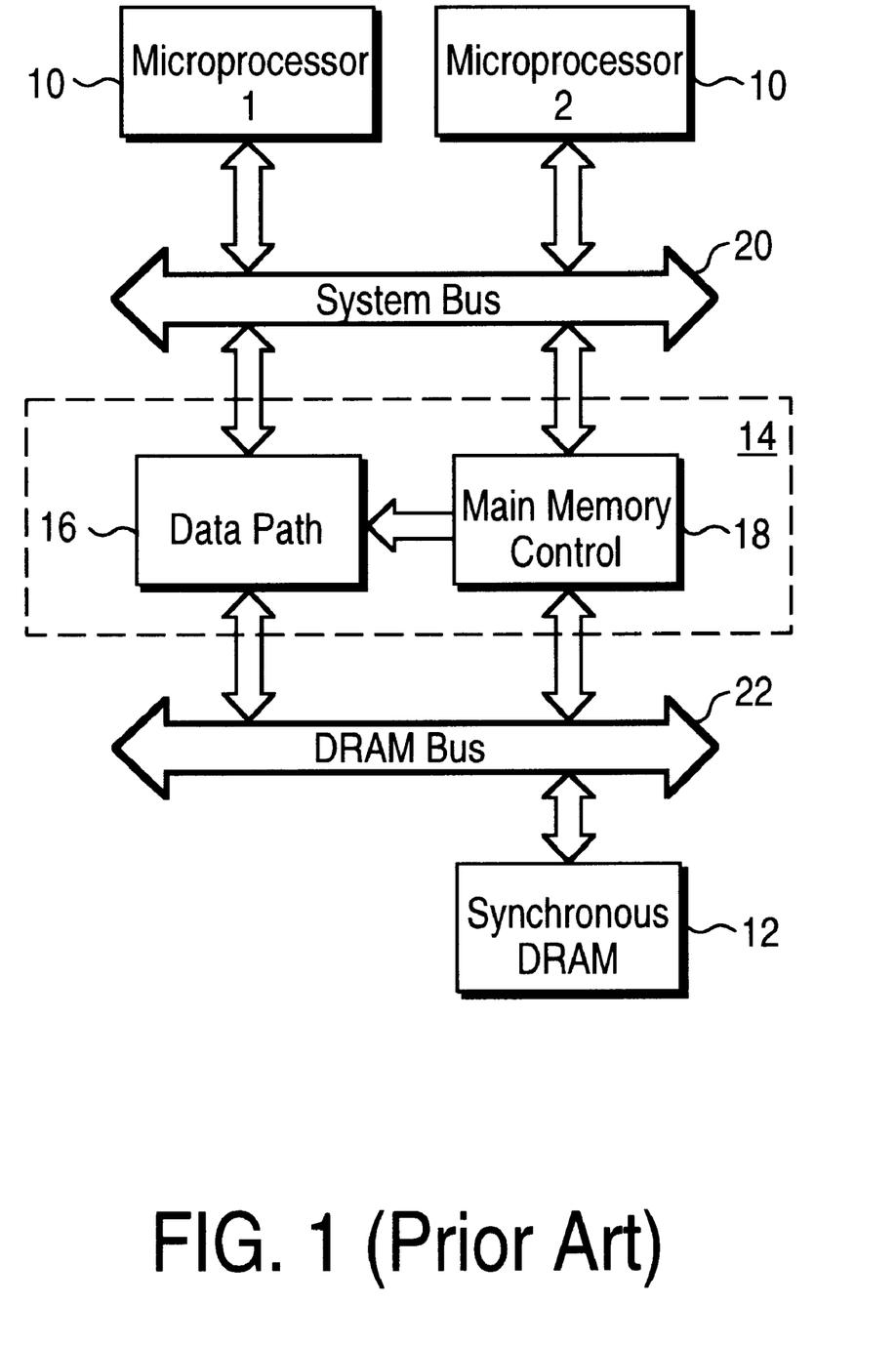
FIG. 1 is a general block diagram of a computer system employing a memory control of the prior art.

The present invention provides a method and apparatus for controlling data transfer between a synchronous DRAM-type memory (syncDRAM) and a system bus. As can be seen in FIG. 1, a typical computer system can have one or more microprocessors 10 communicating with the system bus 20. A conventional computer system further comprises various memory banks that can include syncDRAM memory. The microprocessors communicate with the syncDRAM memory 12 through an intermediate memory control 14 included in the intermediate memory control is a datapath 16 through which data is transferred from any one of the microprocessors to the syncDRAM and a data path controller 18 that provides an interface among the datapath 16, the system bus 20 and a DRAM bus 22 that ultimately communicates with the syncDRAM memory 12.

Figure 2:
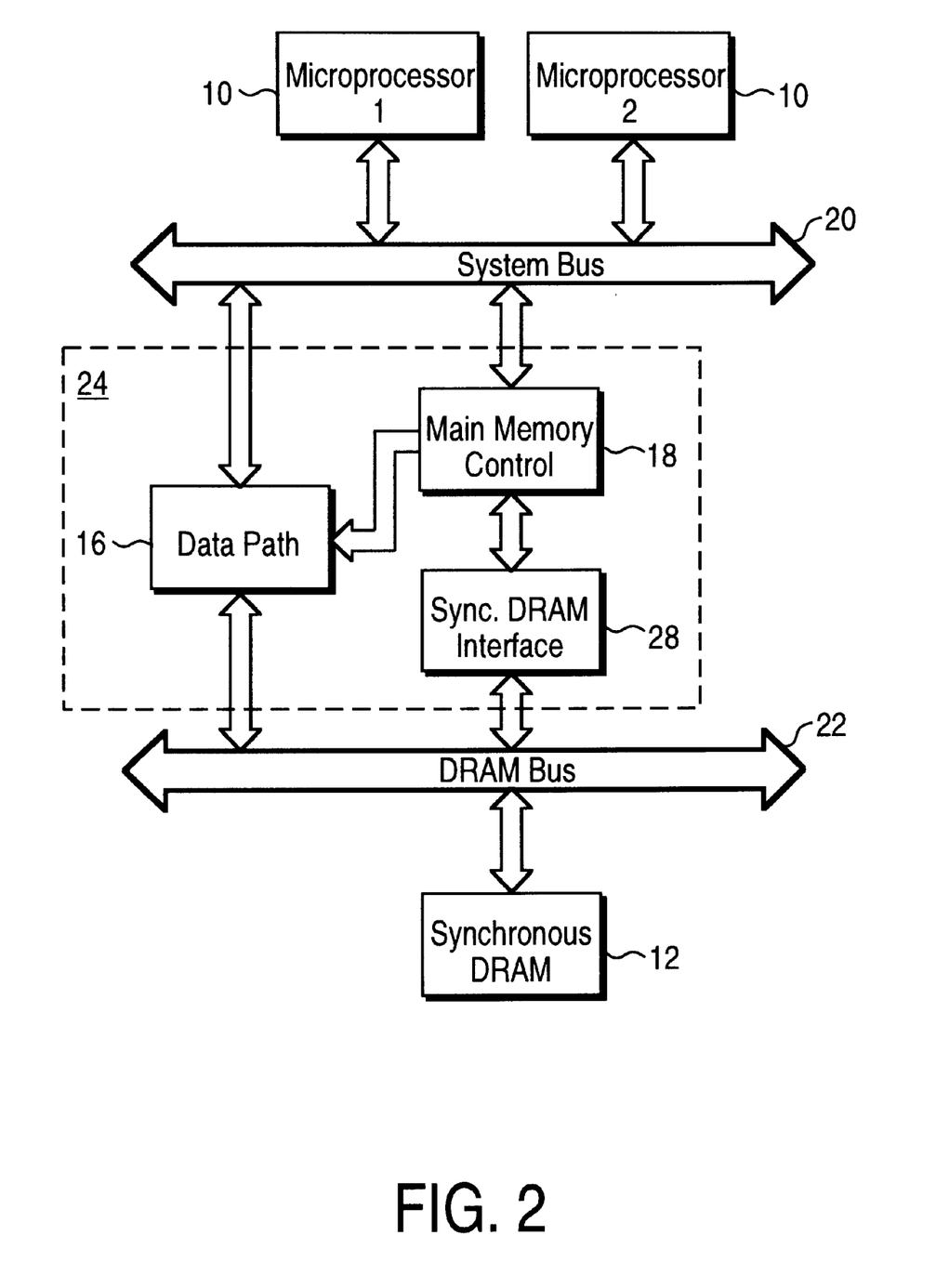
FIG. 2 is a general block diagram of a computer system in employing a memory control and a syncDRAM interface in accordance with one embodiment of the present invention.

In one embodiment of the present invention, as illustrated in FIG. 2, the advance memory control 24 operates similarly as conventional memory controls with an included syncDRAM interface 26, a subject of the present invention, for providing special controls during read/write cycles between the system bus and the syncDRAM when data is not ready to be transferred.

In order to understand the operations of the present invention, an explanation of the operations of a syncDRAM is required. The syncDRAM operates similar to its predecessor DRAM with further advanced features. Unlike conventional DRAMs, the syncDRAM is able to provide bursts of data in a series of 0 to 8 words in a single cycle or, when in page mode, can transfer a burst of an entire page to a destination unit. In a typical sequence, a microprocessor in the computer system will send a read or write request through the system bus to the memory control. The memory control will generate a signal which is sent through the DRAM bus to the syncDRAM for execution. Once the command is received by the syncDRAM, the syncDRAM proceeds with a preprogrammed sequence for transferring the data.

The syncDRAM must be initialized in the power-on sequence, much like conventional DRAMs, before data can be transferred. During initialization, the syncDRAM internal clock and data mask must be activated to avoid having data written into the syncDRAM during the sequence. There is typically a 100 ms delay that proceeds any commands being handled by the syncDRAM after the initiation sequence has begun. When asserting a command, a chip enable must be asserted so that commands are recognized by the syncDRAM for execution. Within the syncDRAM, commands executed correspond to the rising edge of the internal clock. When a command is sent to the syncDRAM, a clock enable signal receives the command and determines the validity of the next clock cycle. If the clock enable is high, the next clock rising edge is valid, otherwise it is invalid. If the clock rising edge is invalid, the internal clock is not asserted and operations in the syncDRAM are suspended. In conventional use, each time a command is asserted to the syncDRAM to transfer data, the chip must be initiated using the chip select and the clock enable in the same clock in order for the command to be recognized by the syncDRAM.

Once the chip is initialized with concurrent chip enable and clock enable commands, data transfer can begin. According to the preset burst rate, a series of words are then transferred to the syncDRAM unit in response to a write request or from the syncDRAM unit in response to a read request. In the case where data is not ready to be transferred, either in a read or write request, the syncDRAM continues to transfer the burst of data regardless of the data's readiness. In the case of a read request, data is continually read from an initial burst start address once initiated. Following the initial transfer of the word from the burst start address, an internal address incrementer in the syncDRAM increments the reading pointer to transfer consecutive words following the burst start address up to the end of the burst length preset by the DRAM whether the data path controller is ready to accept data or not. Similarly, during a write sequence, after an initial word is transferred to the burst start address, the internal incrementer then increments the internal address to receive consecutive words following the burst start address in subsequent addresses regardless of whether or not data is ready at the sending device. The data path controller 18 determines whether data will be transferred. One embodiment of the present invention provides an interface working in conjunction with the main memory to recognize that the data path controller 18 is not ready to transfer data either from the sending device in the event of a write request or from the syncDRAM in the event of a read request. The syncDRAM is then held in its then present state by issuing back to back read requests to the same held address until the receiving device is ready to accept data for a read cycle or by asserting DQM commands to mask data in the event of a write cycle.

Figure 3:
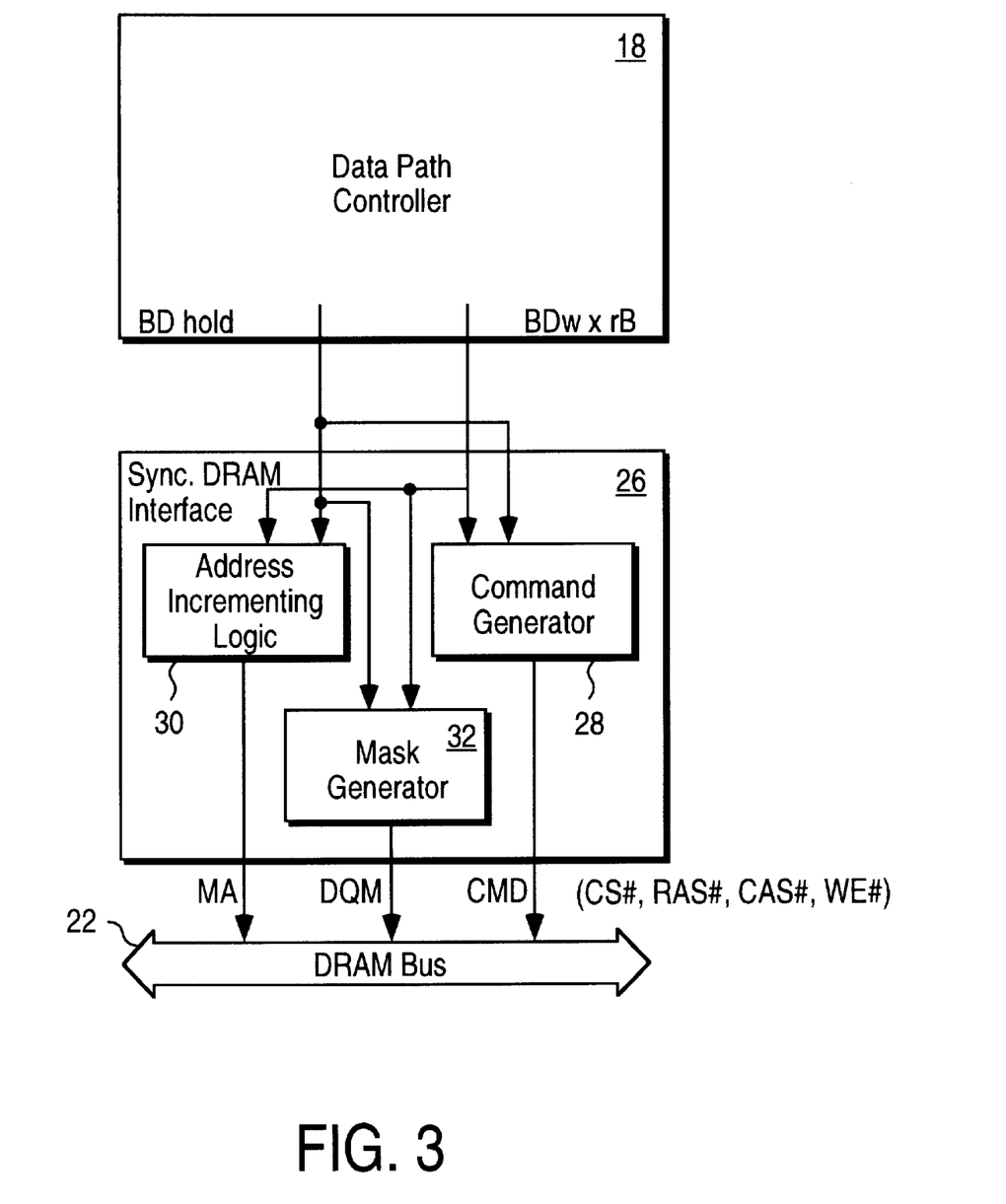
FIG. 3 is a general block diagram of the memory control unit and the syncDRAM interface in accordance with one embodiment of the present invention.

Referring again to FIG. 2, the syncDRAM interface is shown communicating with the data path controller 18 and the DRAM bus 22, with the DRAM bus communicating with the syncDRAM 12. Details of the syncDRAM interface 26 are shown in FIG. 3. The interface 26 includes a command generator 28 communicating with the memory control and the DRAM bus, address incrementing logic 30 communicating with the memory control, the command generator and the DRAM bus and a mask generator 32 communicating with the data path controller 18, the address incrementing logic 30, the command generator 28 and the DRAM bus 22.

The command generator is configured to produce commands to control the syncDRAM including row address strobe (RAS#), column address strobe (CAS#) and write enable (WE#). A chip select (CS#) in the syncDRAM is conventionally controlled internally. In one embodiment of the present invention however, CS# is held active high externally. This allows for back to back read and write requests as will be described in more detail below. These are standard commands that are recognized by syncDRAMs in their conventional implementation. These commands are similar to conventional DRAMs, but have additional functions. In a system where DRAMs and syncDRAMs are implemented among other types of memory in a single computer system, these commands may be distinguished by SCS#, SRAS#, SCAS# and SWE# respectively to associate the commands specifically with the syncDRAM in the system.

The mask generator 32 controls the syncDRAM command data mask (SDQM) that is configured to mask out addresses in the syncDRAM in order to block data from being written into the masked address. This function is used in conjunction with the syncDRAM interface 26 in one embodiment of the present invention as will be discussed below.

The syncDRAM interface 26 further includes address incrementing logic 30 that keeps account of the internal address incremented in the syncDRAM during a burst by holding the address in the main memory control. This address is outputted on memory address (MA) lines 23. This function will be described in further detail below.

Figure 5:
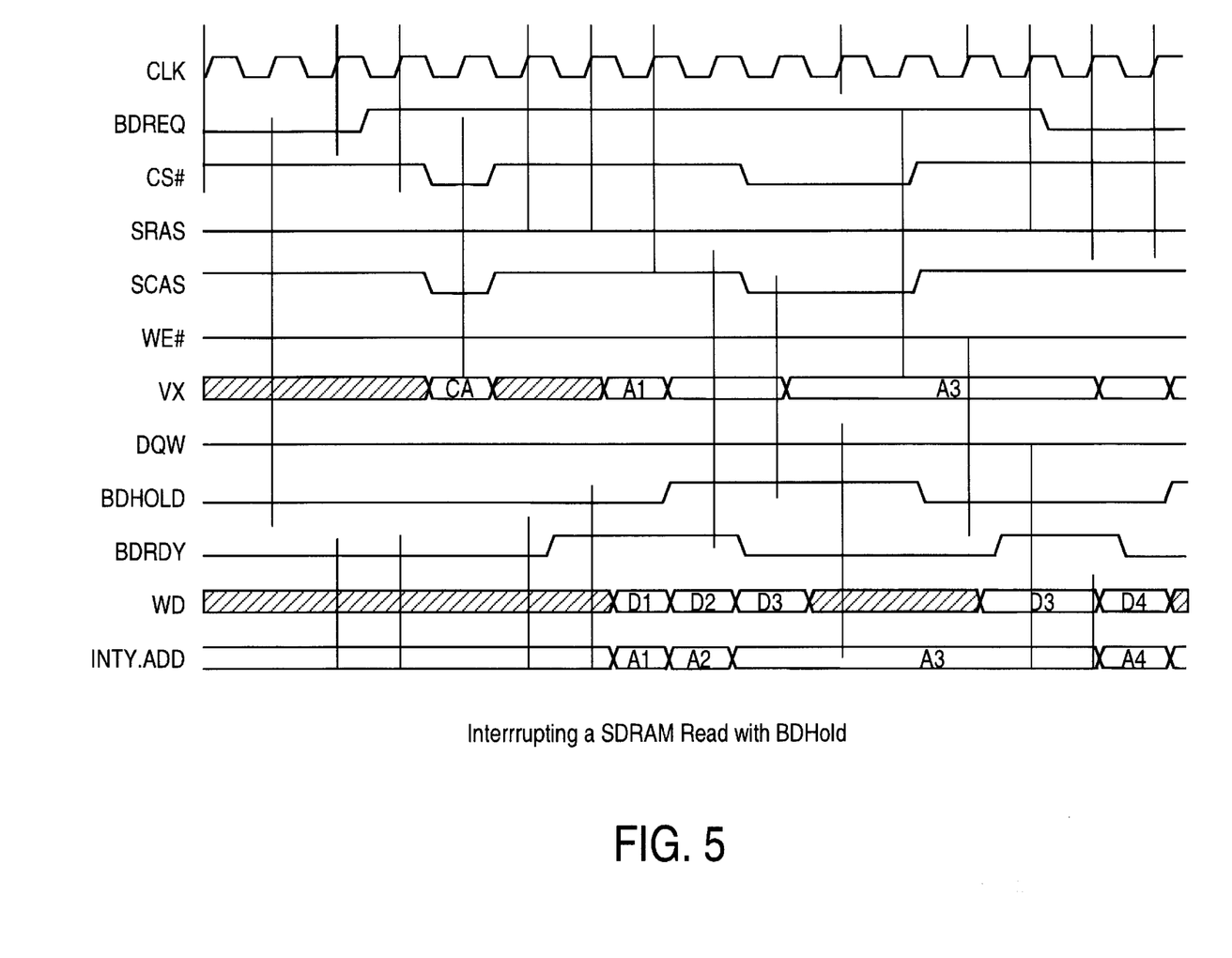
FIG. 5 is a time diagram illustrating commands utilized in read requests in accordance with one embodiment of the present invention.
Figure 6:
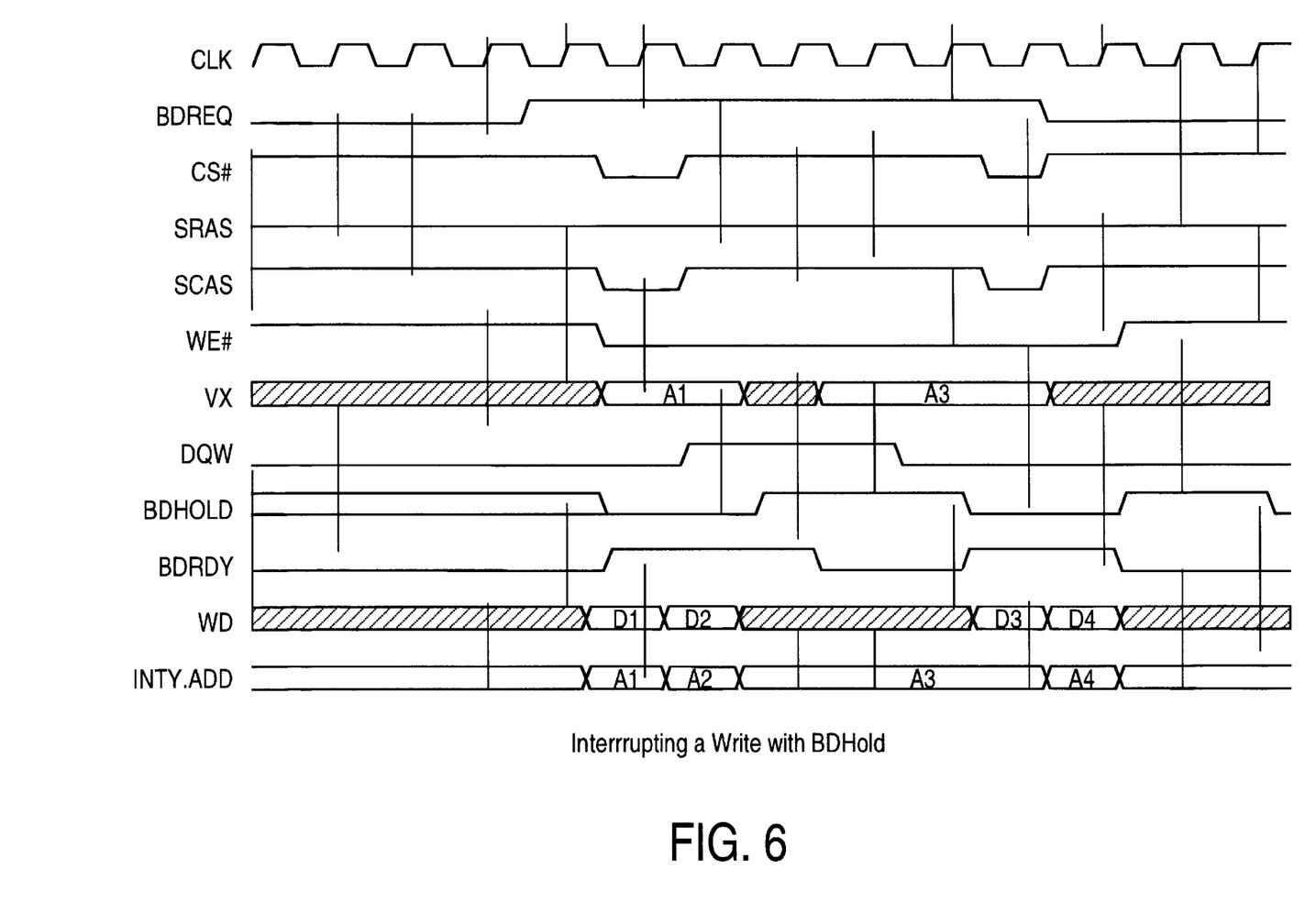
FIG. 6 is time diagram illustrating commands utilized in write requests in accordance with one embodiment of the present invention.

Details of one embodiment of the present invention is best described by its function which is best described with reference to the flow diagram of FIG. 4. This embodiment will be described in conjunction with the timing diagram of FIGS. 5 and 6 which show the sequence of commands with respect to time in the case of a read request in FIG. 5 and in the case of a write request in FIG. 6. Specifically, FIGS. 5 and 6 illustrate an address (MA) signal outputted from logic 30 on MA lines 23, a data mask (DQM) signal, a burst data request (BDREQ) signal, a burst data ready (BDRDY) signal, a data (WD) signal, and an internal address (INTY.ADD) of the address incrementing logic 30.

Figure 4:
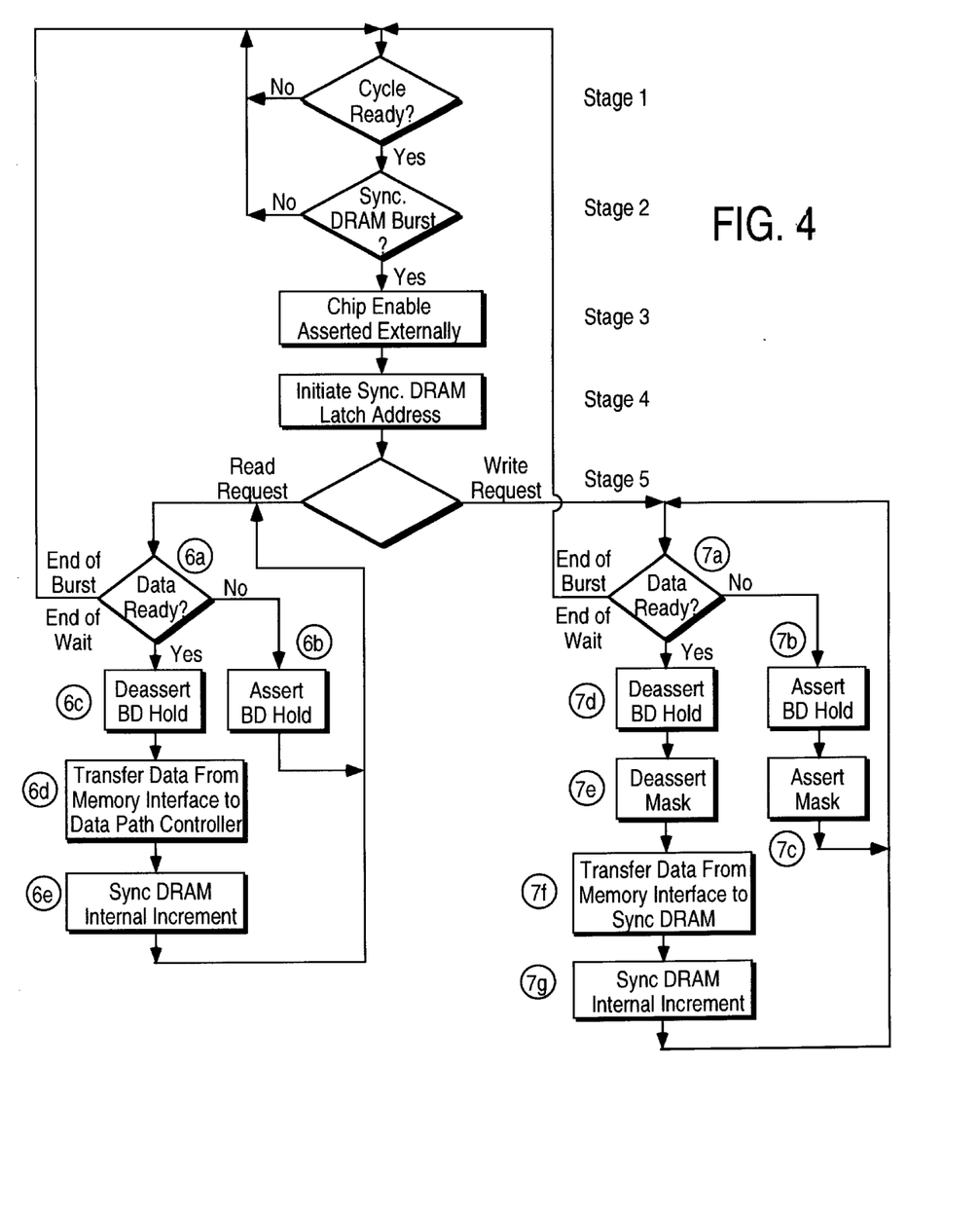
FIG. 4 is a flow chart for describing functional aspects of one embodiment of the present invention.

Referring now to the flow chart of FIG. 4, it can be seen that the first five stages consisting of the initiation of the syncDRAM are common to both read and write requests. In stage 1, the memory control determines whether the cycle is ready. In order for the interface to respond, a primary request must first be sent through the system to begin data transfer from the syncDRAM memory, a primary request being a read or write request originating from a microprocessor in the system and being sent through the system bus and the main memory to initiate the syncDRAM.

The function of the syncDRAM interface in accordance with the present invention operates only in response to a burst sequence that has begun in response to a primary request. This leads to the second requirement in stage 2 where a syncDRAM burst has begun. The syncDRAM is initiated and latches an address to be read from or written to in stage 4. This is accomplished by asserting the read/write command to latch the address to be written to or read from. This is possible because the CKE# is always asserted in this embodiment. As can be seen from the timing diagram of FIG. 5 and FIG. 6, this is true for both read and write requests respectively. In stage 5 in the both read and write request, the data path control must distinguish between read and write requests for the final stages. This is accomplished by asserting a command within the data path control so that the read and write requests are handled accordingly. The data path control then initiates the syncDRAM interface to send back to back read or write requests to the syncDRAM.

Still referring to FIG. 4, in the case of a read request, stage 6a comes into play. Under normal circumstances when data is ready, the system proceeds to steps c, d and e where no hold command is asserted and data transfer commences from, at the start, the burst start address. Then, in step 6e, the incrementer internal to the syncDRAM increments the address to the next address subsequent to the burst start address. The system then returns to stage 6a, where it is then determined whether data is ready.

The data receiver indicates its readiness to accept the read data via the BDhold command. Afterward, an internal incrementer shown at stage 6e increments the next address, A2 in FIG. 5, to deliver data D2. In the event that the data is not ready to be received during a read cycle, step 6b comes into play. In the event the interface is not ready to accept the data, it will assert Burst Data Hold (BDhold) to the memory controller. The memory controller in turn will begin initiating back to back reads to the required address to effectively stop the burst. In the present case, the controller does back to back reads to A3. The address incrementing logic 30 in FIG. 3 continues to latch the internal address A3 shown in FIG. 5 in the event that the data D3 cannot yet be accepted. Once data is ready, the hold command is deasserted and two clocks later the data is ready to be read from address A3 with the Burst Data Ready (BDready) signal active. From here, the internal incrementer again takes over and provides data D4 from address A4. In this example, the burst rate has been set at 4, so that a burst of four words is read from a single initiation of the syncDRAM. Therefore, at the end of the fourth data word transfer, the burst cycle is ended and the system returns to stage 1 for a new cycle.

In a conventional system without the aid of the syncDRAM interface described in this embodiment, the syncDRAM would continue to read from the data locations indicated by the burst cycle whether or not the interface was ready to accept data. In that case, improper data would be transferred. In order to retrieve proper data in the conventional system, either the clock enable (CKE#)pin would have to be deactivated or a second read request would have to be sent from the microprocessor through the system to initiate the syncDRAM again and perform a second burst to retrieve data items 3 and 4 from addresses A3 and A4. If a second read request were used, it would require enabling the chip and asserting the row address strobe all over again (stages 1–5 in FIG. 4) to retrieve the remaining data items.

With use of the new syncDRAM interface, the syncDRAM is forced to wait while keeping the last address latched where data is not already retrieved, so that when data is ready the data can be transferred. This saves much needed time lost by constantly readdressing the syncDRAM to retrieve a block of data each time data is not ready. This helps adjust the syncDRAM to the microprocessor and destination devices which all may have different speed and data transfer requirements. If the CKE# pin is used, then one CKE# pin would be required for each syncDRAM data bank for throttling each syncDRAM each time data is not ready. In conventional implementations of syncDRAMs, the CKE# pin is used to deactivate the syncDRAM each time data is not ready and to subsequently reactivate the syncDRAM when the data becomes available.

Furthermore, flight time of a signal, that being the time it takes for a signal to travel from its originating source, i.e. the microprocessor, to the syncDRAM device, becomes a major issue on heavily loaded systems. This is why conventional implementations of multiple syncDRAMs require multiple CKE# pins to operate properly. It is important that a data transfer request originating from the main system reaches the syncDRAM on the same clock cycle. The more syncDRAMs that are implemented, the more the system is loaded and, as a result, the longer it takes for the signal to propagate to the syncDRAMs. In a heavily loaded system, the signal may reach the syncDRAM too late, particularly, on the next clock, so that the system will write and spool data into the syncDRAM on the wrong clock. To get around this, if a multiple of syncDRAM memory banks were required for a computer system, a clock enable pin would be needed for each bank to ensure that the load on each pin is minimal. Utilizing the present invention, these pins are not needed. This results in reducing the die size of a controller chip employing this embodiment resulting in cost savings.

In the case of a write request, the system proceeds with stage 7a shown in FIG. 3. The corresponding time diagram is shown in FIG. 6. Similar to the read cycle, when data is ready, the system proceeds to steps 7d through g, where the hold signal is not asserted, the data mask (DQM) is not asserted, data is written to the address, initially at the burst start address and, afterward, the internal syncDRAM address is incremented to the next address following the burst start address. The system then returns back to stage 7a to inquire if data is ready. In the event that data is not ready, the system proceeds to stage 7b where a hold signal is sent to the syncDRAM interface from the data path controller. This operates similarly to the read cycle where the last address latched in the syncDRAM is held latched until data is ready. Simultaneously, the mask generator 32 shown in FIG. 3, asserts a data mask signal (DQM) to mask the data in the last address to avoid further writing to the address. Otherwise, the syncDRAM will continue to write invalid data to the address.

As shown in FIG. 6, where this example has only the first two data words available at addresses A1 and A2, once the BDhold signal is asserted, the data mask signal DQM is asserted high. As shown in FIG. 6, the DQM signal is low only when data is being written to an address and is high otherwise to ensure that the addresses are masked to avoid invalid data being written to them. Again, in the presently described embodiment, the CKE pin is continually asserted high. In conventional implementations of syncDRAMs, the CKE pin would be used to deactivate the syncDRAM in order to prevent continued writing to the syncDRAM when the data path control is not ready to transmit data.

In accordance with this embodiment, the DQM command is held high when the data path controller is not ready to transfer data. This DQM masks the data at the address so that, although data may continue to be sent to the syncDRAM for writing, no data will be written to the masked address.

This configuration allows for elimination of the CKE pin. In modern computer systems, information flows at progressively higher rates, imposing a heavy load on pins and connectors within the systems. Configurations that can be designed to eliminate those pins can support greater memory loads at higher frequencies and also reduce the die size of the memory controller.

From the above description, it will be apparent that the invention disclosed herein provides a novel and advantageous method and apparatus for controlling data transfer between a synchronous DRAM-type memory and a system bus. As will be understood by those familiar with the art, the invention may be embodied in other specific forms without departing from its spirit or essential characteristics, and thus, the described embodiment is not restrictive of the scope of the invention. The following claims are indicative of the scope of the invention, and all variations which come within the meaning and range of equivalency of the claims are to be embraced within their scope.

What is claimed is:

1. A method of controlling data flow between a memory and a device comprising the steps of:

receiving a data transfer request in the form of a read request to read data from the memory or in the form of a write request to write data into the memory;

asserting a read/write command in response to the data transfer request to set a burst start address indicating where the data will be transferred to in the memory in response to the write request or indicating where the data will be transferred from in response to the read request;

(1) in response the read request:
   (a) transferring a first portion of the data from the burst start address to the device;
   (b) initiating transfer of a second portion of the data from addresses immediately subsequent to the burst start address to the device;
   (c) in response to the device not being ready to receive the second portion of the data from the memory, asserting a hold signal to a memory controller to suspend the data transfer, the memory controller latching a last address from which the second portion of the data was to be transferred from the memory; and
   (d) in response to the data being ready to be transferred from the memory, deasserting the hold signal to the memory controller and resuming data transfer from the last address; and (2) in response to the write request:
   (a) transferring a third portion of the data to the burst start address from the device;
   (b) initiating transfer of a fourth portion of the data from the device to addresses immediately subsequent to the burst start address;
   (c) in response to the fourth portion of the data not being ready, asserting a hold signal to the memory controller to suspend data transfer indicating that the device is not ready to send data, the memory controller latching a further last address to which the fourth portion of the data was to be transferred to in the memory, sending a masking signal from a mask generator in response to the hold signal to the memory to avoid data transfer to the further last address; and,
   (d) in response to data being ready, deasserting the hold signal to the memory controller and resuming data transfer to the further last address to which the fourth portion of the data was to be transferred.

* * * * *

UNITED STATES PATENT AND TRADEMARK OFFICE
CERTIFICATE OF CORRECTION

PATENT NO. : 5,926,828
DATED : July 20, 1999
INVENTOR(S) : Narendra S. Khandekar It is certified that error appears in the above-identified patent and that said Letters Patent is hereby corrected as shown below:

In column 7 at line 29 delete "CKE" and insert -- CKE# --
In column 7 at line 31 delete "CKE" and insert -- CKE# --
In column 7 at line 41 delete "CKE" and insert -- CKE# --

Signed and Sealed this

Twenty-eighth Day of March, 2000

Attest:

Attesting Officer

Q. TODD DICKINSON

Commissioner of Patents and Trademarks